(12) United States Patent
Martin

(10) Patent No.: US 6,908,793 B2
(45) Date of Patent: Jun. 21, 2005

(54) METHOD FOR FABRICATING A SEMICONDUCTOR DEVICE

(75) Inventor: Mark N. Martin, Columbia, MD (US)

(73) Assignee: The Johns Hopkins University, Baltimore, MD (US)

(*) Notice: Subject to any disclaimer, the term of this patent is extended or adjusted under 35 U.S.C. 154(b) by 0 days.

(21) Appl. No.: 10/416,558
(22) PCT Filed: Nov. 13, 2001
(86) PCT No.: PCT/US01/51193
§ 371 (c)(1), (2), (4) Date: May 12, 2003
(87) PCT Pub. No.: WO02/059939
PCT Pub. Date: Aug. 1, 2002

(65) Prior Publication Data
US 2004/0013867 A1 Jan. 22, 2004

Related U.S. Application Data
(60) Provisional application No. 60/252,504, filed on Nov. 22, 2000.

(51) Int. Cl.[7] .............................................. H01L 21/44
(52) U.S. Cl. ..................... 438/118; 257/758; 257/759
(58) Field of Search ........................... 438/118, 53, 54, 438/522; 257/522

(56) References Cited

U.S. PATENT DOCUMENTS

| 5,726,480 A | 3/1998 | Pister | |
| 2003/0127740 A1 * | 7/2003 | Hsu et al. | 257/758 |
| 2003/0138986 A1 * | 7/2003 | Bruner | 438/52 |

FOREIGN PATENT DOCUMENTS

| JP | 58035966 | 8/1981 |
| JP | 62277739 | 12/1987 |
| JP | 02253661 | 3/1989 |
| JP | 05013359 | 6/1991 |
| JP | 09027620 | 7/1995 |

OTHER PUBLICATIONS

Patent Abstracts of Japan JP 11 004023 A (NEC Corp), Jun. 1, 1999 abstract.
Anonymous: "Directional Etching With XeF(2) and Other Active Gases, Sep. 1979." OIBM Technical Disclosure Bulletin, vol. 22, No. 4, Sep. 1, 1979, p. 1640.
Dissertation: "The Application of Photoluminescence to the Optimization of Indium Phosphate MIS Technology (Indium Phosphate, Phosphate)",Ray R. Chang, vol. 50–12B, PP 5790 (194 pages); Colorado State University, 1989.
Correlation of Tensile Properties to the Amounts of Gas Porosity in Permanent Mold Test Bars, M. J. Young, Conference: Transactions of the American Foundrymen's Society v 89., AFS, DesPlaines, Illinois pp. 465–468, 1982.
Surface–micromachined accelerometer using a movalbe polysilicon gate FET, Jae–Hoon Chung and James Jungho Pak; Proc. SPIE—Int. Soc. Opt. Eng. (USA), vol. 3242, pp 96–104, 1997.
Study on InP MIS FET using photo–assisted CVD, T. Sugano, F. Arai, and H. Okasaki; Annu. Rep. Eng. Res. Inst. Fac. Eng. Univ. Tokyo (Japan), vol. 49, pp. 87–92, Sep. 1990.

* cited by examiner

Primary Examiner—Hoa Pham
Assistant Examiner—Nathan W. Ha
(74) Attorney, Agent, or Firm—Benjamin Y. Roca

(57) ABSTRACT

A process for fabricating a semiconductor device having, for example, a MISFET transistor, is provided which comprises the steps of (a) providing a partially fabricated semiconductor device comprising a substrate and a first and second polysilican layer insulatively spaced from the substrate by an insulating layer, the insulating layer having an opening therein which exposes the surface of the first polysilicon layer positioned below the second polysilicon layer and (b) exposing the partially fabricated semiconductor device to a noble gas halide to substantially remove the first polysilicon layer.

14 Claims, 3 Drawing Sheets

METHOD FOR FABRICATING A SEMICONDUCTOR DEVICE

CROSS-REFERENCE TO RELATED APPLICATIONS

This application claims the benefit of prior filed co-pending U.S. Application No. 60/252,504, filed on Nov. 22, 2000, the contents of which are hereby incorporated by reference herein.

BACKGROUND OF THE INVENTION

1. Technical Field

The present disclosure generally relates to a method for fabricating a semiconductor device having e.g., a micromachined metal-insulator semiconductor field effect transistor ("MISFET"), employing a gas phase etching step.

2. Description of the Related Art

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC leads to higher yield in IC fabrication. Such advantages are a driving force to constantly scale down IC dimensions.

A common component of a monolithic IC is a MOSFET (Metal Oxide Semiconductor Field Effect Transistor) which is fabricated on a semiconductor substrate. As generally depicted in FIG. 1, the MOSFET 10 typically includes a source region 14 and a drain region 15 spaced apart in the substrate 11 with area between the source and drain region defining a channel 11a. The MOSFET 10 further includes insulating layers 16, 18 and 20 on the substrate and a gate 22, e.g., a polysilicon gate, which is encapsulated in the insulating layers 16, 18 and 20. To create a gate structure 22 that is physically suspended above the channel region 11a, it is necessary to remove the insulating layer 16 deposited between the gate 22 and substrate 11. This is usually accomplished by employing $SiO_2$ as the insulating material under the gate only and using a different insulating material such as, for example, SiN, for all other insulating layers formed around and encapsulating the gate 22. During fabrication of the MOSFET 10, an opening 24 is formed in the insulating layers 18 and 20 and exposing the surface of insulating layer 16 (i.e., $SiO_2$). Next, insulating layer 16 is removed by an etching step that employs a wet etchant, e.g. HF, that dissolves and removes insulating layer 16 but does not dissolve and remove insulating layers 18 and 20 (i.e., SiN). However, the use of multiple insulation types involves specialized processing that results in a more costly and non-portable fabrication process. The use of wet etchants are also time intrusive since this etching technique often requires the use of chemicals that are difficult to use, i.e., etchants which are temperature sensitive and often highly caustic.

It would be desirable to provide a less time invasive etching technique to remove layer from under the gate of a partially fabricated MOSFET that also does not result in the use of specialized IC manufacturing processes or wet chemical etchants.

SUMMARY OF THE INVENTION

It is an object of the present invention to provide a method for fabricating a semiconductor device having a MISFET wherein the manufacturing efficiency is enhanced and the manufacturing cost is lowered by allowing for a less time intrusive fabrication etching step by removing a polysilicon layer encapsulated in a gate insulating layer having an opening therein such that a portion of the surface of the polysilicon layer is exposed.

It is a further object of the present invention to provide a method for fabricating a semiconductor device without the use of wet etchants when performing an etching step to remove the polysilicon layer from a partially fabricated semiconductor device wherein the partially fabricated device comprises a substrate, a first polysilicon layer positioned below a second polysilicon layer and an insulating layer formed on the substrate and encapsulating the first and second polysilicon layers wherein the insulating layer has an opening therein and exposing at least a portion of the surface of the first polysilicon layer.

Yet a further object of the present invention is to provide a sensor by at least filling a portion of the opening formed following the etching step with material having the characteristics of the desired sensor, e.g., a temperature sensor, pressure sensor, radiation sensor, etc.

In keeping with these and other objects of the present invention, a method for fabricating a semiconductor device is provided which comprises the steps of:

(a) providing a partially fabricated semiconductor device, the device comprising a substrate, a first polysilicon layer positioned below a second polysilicon layer and an insulating layer formed on the substrate and encapsulating the first and second polysilicon layers wherein the insulating layer has an opening therein and exposing at least a portion of a surface of the first polysilicon layer; and (b) exposing the partially fabricated device to a noble gas halide to substantially remove the first polysilicon layer.

Another embodiment of the present invention, a method for fabricating a semiconductor device is provided which comprises the steps of:

(a) providing a partially fabricated semiconductor device comprising:

spaced apart source and drain regions formed in a semiconductor substrate with the space between the source and drain regions defining a channel region;

a first polysilicon gate insulatively spaced from the channel region in the substrate and from the region outside the channel region by a gate insulating layer and a second polysilicon gate insulatively spaced from the first polysilicon gate over the channel region between the source and drain region by the insulating layer which encapsulates the first and second polysilicon gates; and an opening formed in the insulating layer and exposing at least a portion of a surface of the first polysilicon gate outside the channel region; and (b) exposing the partially fabricated semiconductor device to a noble gas halide to substantially remove the first polysilicon gate.

BRIEF DESCRIPTION OF THE DRAWINGS

The present invention may be more fully understood from the detailed description given below and from the accompanying drawings of the preferred embodiments, which are described as follows.

DETAILED DESCRIPTION OF THE PREFERRED EMBODIMENTS

In accordance with the methods described herein, a semiconductor device can be produced with a less time invasive etching technique to remove layer from under the gate that also does not result in the use of specialized IC manufacturing processes or wet chemical etchants during fabrication by exposing a partially fabricated semiconductor device to a gas phase etchant.

Figure 1:
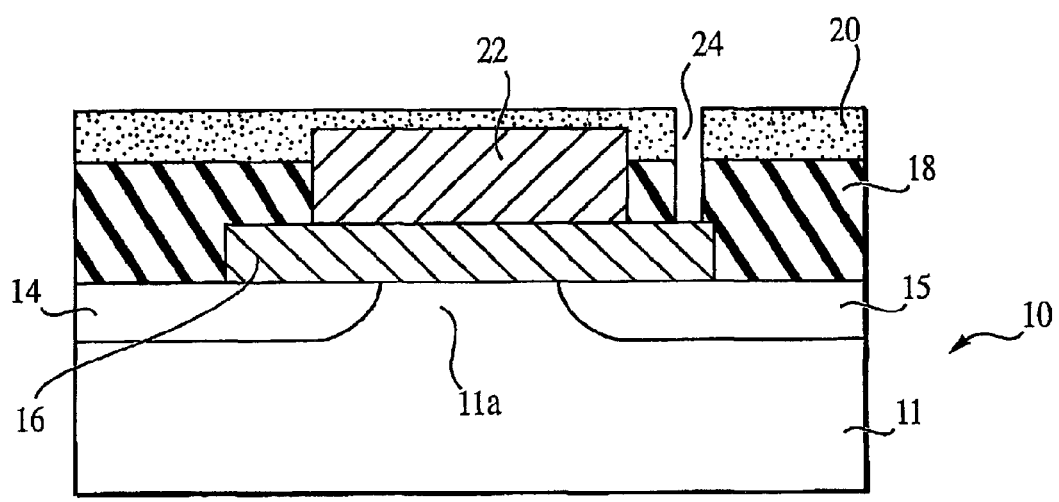
FIG. 1 is a cross-sectional view of a prior art partially fabricated semiconductor.
Figure 2:
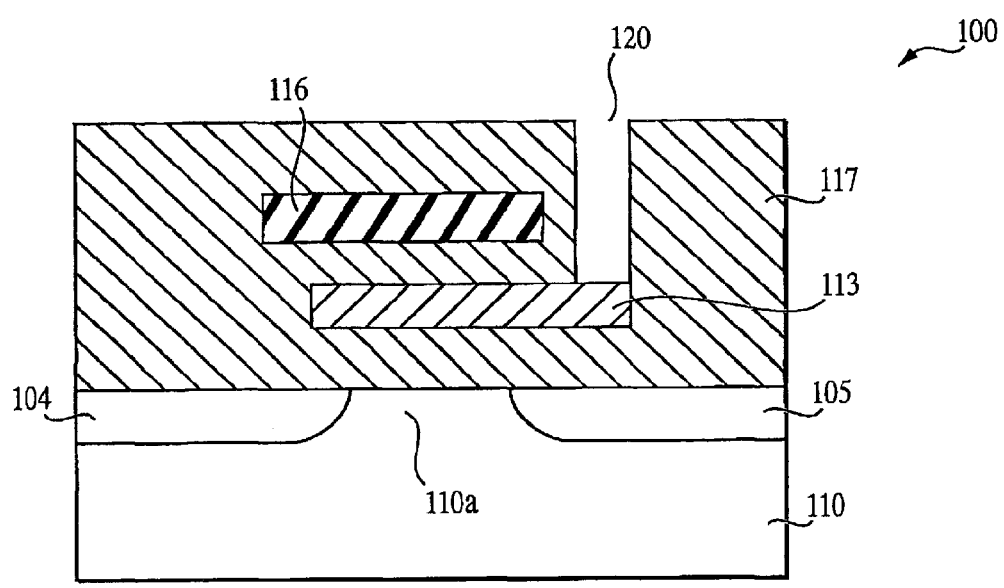
FIG. 2 is a cross-sectional view of the partially fabricated semiconductor in accordance with the present invention.

FIG. 2 is a cross-sectional view of a partially fabricated MOSFET device 100 in accordance with an illustrative, but non-limiting, embodiment of the present invention. In general MOSFET 100 includes at least spaced apart N-type source/drain and drain/source regions 104 and 105 formed in, for example, a P-type well, of a semiconductor substrate 110. Semiconductor substrate 110 used in the method and described herein is of the conventional type and may contain, for example, circuitry and other interconnection levels. The substrate 110 may comprise silicon, germanium, gallium arsenide or other presently known or later-discovered materials that are suitable for the manufacture of such semiconductor devices with silicon being preferred for use herein.

The spaced apart source and drain regions 104 and 105 define a channel region 110a therebetween. A first polysilicon gate 113 and a second polysilicon gate 116 and both gates are insulatively spaced from channel region 110a and encapsulated within insulating layer 117. It is to be understood that first polysilicon gate 113 is advantageously positioned below second polysilicon gate 116 and is also insulatively spaced from the region outside the channel region 110a. Also, second polysilicon gate 116 is insulatively spaced from first polysilicon gate 113 over at least the channel region between the source region 104 and drain region 105.

Suitable materials for insulating layer 117 included any conventional oxide material known to one skilled in the art. Preferred materials include, but are not limited to, $SiO_2$, SiN, $Ta_2O_5$, $ZrO_2$, $HfO_2$, BST, $TiO_2$, $TiSi_xO_y$, Zr—Al—O, $SrTiO_3$ and the like with $SiO_2$ being preferred for use herein. The insulating layer 117 advantagously acts as a hardmask to polysilicon gate 116 when the device 100 is exposed to the noble gas halide, which is discussed hereinbelow. Techniques and parameters for forming first and second polysilicon gates 113 and 116 and insulating layer 117 on substrate 110 (e.g., chemical vapor deposition, physical vapor deposition, time, temperature, thickness, etc.) are within the purview of one skilled in the art.

Opening 120 can be formed in insulating layer 117 and exposing the surface of polysilicon gate 113 by techniques known in the art. For example, a resist layer (not shown) can be applied to the top surface of insulating layer 117. The resist layer is patterned and developed using known photolithographic techniques. Then etching is conducted to form opening 120 by, such as, employing a suitable anistropic etching technique, e.g., reactive etching. The etching is continued for a time sufficient to etch through insulating layer 117 to the top surface of polysilicon gate 113. A desired width of the opening will normally vary according to the etch-rate requirements for a given floating gate geometry.

Figure 3:
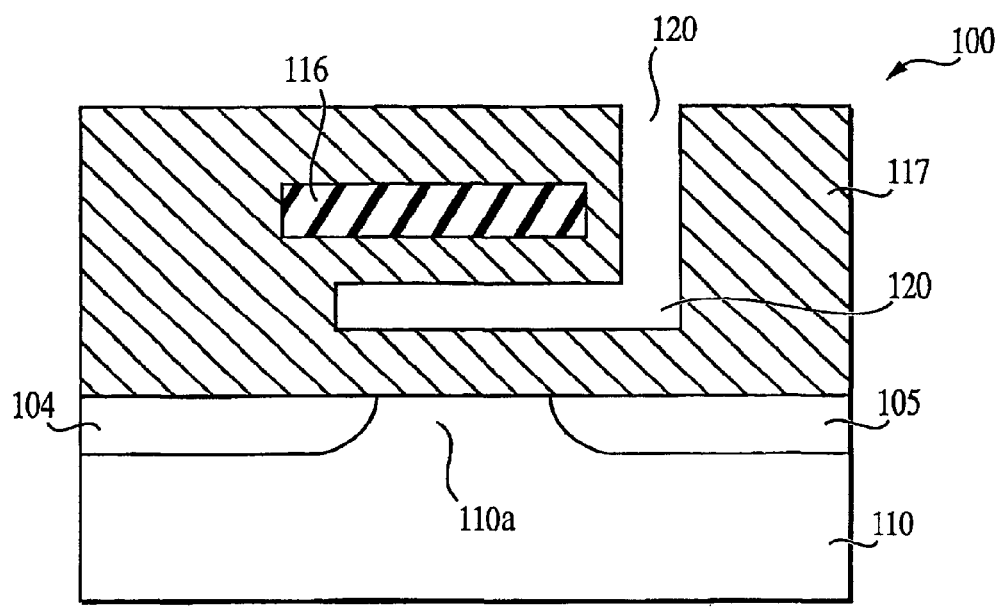
FIG. 3 is a cross-sectional view of the partially fabricated semiconductor device of FIG. 1 following the step of exposing the device to a noble gas halide.

Next, a gas phase etching step is performed on the top surface of partially fabricated semiconductor device 100 to substantially remove polysilicon gate 113 and form a device having physical activity between the gate 116 and the channel region 111a. Specifically, a new system has been developed which etches the polysilicon gate 113 highly selectively at moderate temperatures without overetching of the partially fabricated device 100. The system is based on the use of a noble gas halide as the gas phase etchants which reacts with the silicon of polysilicon gate 113 to form, e.g., in the case of xenon difluoride as the noble gas halide, the gas silicon-fluoride, which then allows the polysilicon gate 113 to be removed from the device 100. Thus, by silicon reacting with the noble gas halide, the reaction etches away the silicon of polysilicon gate 113 to provide an extension of opening 120 as generally depicted in FIG. 3. Additionally, by encapsulating the second polysilicon gate in the insulating layer, the insulating layer 117 acts as a hardmask and therefore the second polysilicon gate 116 is not exposed to the gas and remains intact. Suitable noble gas halides for use herein as the gas phase etchant include but are not limited to, xenon diflouride, xenon dibromide, etc.

According to the method of the invention, once the partially fabricated semiconductor device 100 has been received from the fabrication facility, the device 100 will be exposed to the gas phase etchant by any conventional method known to one skilled in the art. For example, the device 100 can be placed in a chamber which is typically connected by a valve to a source of the noble gas halide. Gas or nitrogen is purged to the chamber through the valve such that once the chamber, with device 100 placed therein, has been pumped down to a moderate vacuum by a pump, the valve is opened to allow the noble gas halide in the chamber at low pressure. The etch is performed in the vapor phase at room temperature with no external energy sources at a pressure ordinarily ranging from about 50 mTorr to about 200 mTorr and preferably from about 100 mTorr to about 150 mTorr. The polysilicon gate 113 will typically be exposed to the gas in an amount sufficient to remove the polysilicon gate 113. As one skilled in the art would readily appreciate, the amount of noble gas halide sufficient to remove the polysilicon gate 113 from device 100 is ordinarily dependent on several factors including, but not limited to, the volume of the polysilicon that is exposed to the gas, the volume of the reaction chamber (which is dependent on the size of device 100) and the pressure of the gas flowing into the chamber. The amounts of gas thus necessary to remove the polysilicon gate 113 from the device 100 can be experimentally determined by one skilled in the art. It is to be understood there may be small amounts of polysilicon that remain in the opening 120 following the etching step.

Once the device 100 has been exposed to the noble gas and the polysilicon gate 113 has been substantially removed, additional conventional processing steps can then be performed to further complete fabrication of the device. For example, opening 120 can be filled with a material having the characteristics of a desired sensor, e.g., a temperature sensor, pressure sensor, radiation sensor, etc, and then completing the fabrication of the device to form the sensor. It is also contemplated that the etched device can be subjected to further processing steps to form, e.g., accelerometers, microphones, etc.

Although the method disclosed herein has been described in its preferred form with a certain degree of particularity, obviously many changes and variations are possible therein and will be apparent to those skilled in the art after reading the foregoing description. It is therefore to be understood that the present method may be presented otherwise than as specifically described herein without departing from the spirit and scope thereof.

What is claimed is:

1. A method for fabricating a semiconductor device comprising the steps of:
   (a) providing a partially fabricated semiconductor device, the device comprising
      a substrate,
      a first polysilicon layer positioned below a second polysilicon layer and an insulating layer formed on the substrate and encapsulating the first and second polysilicon layers wherein the insulating layer has an opening therein and exposing at least a portion of a surface of the first polysilicon layer; and
   (b) exposing the device to a noble gas halide to substantially remove the first polysilicon layer.

2. The method of claim 1 wherein the insulating layer is formed from a material selected from the group consisting of $SiO_2$, SiN, $Ta_2O_5$, $ZrO_2$, $HfO_2$, BST, $TiO_2$, $TiSi_xO_y$, Zr—Al—O and $SrTiO_3$.

3. The method of claim 1 wherein the insulating layer is formed from silicon dioxide.

4. The method of claim 1 wherein the device is exposed to gas phase xenon difluoride or xenon dibromide.

5. The method of claim 1 wherein the device is exposed to the noble gas halide at ambient temperature without external heating.

6. The method of claim 5 wherein the device is exposed to the noble gas halide under a partial vacuum.

7. The method of claim 1 wherein the partially fabricated semiconductor device is a MOSFET.

8. A method for fabricating a semiconductor device comprising the steps of:
   (a) providing a partially fabricated semiconductor device comprising:
      spaced apart source and drain regions formed in a semiconductor substrate with the space between the source and drain regions defining a channel region;
      a first polysilicon gate insulatively spaced from the channel region in the substrate and from the region outside the channel region by a gate insulating layer and a second polysilicon gate insulatively spaced from the first polysilicon gate over the channel region between the source and drain region by the insulating layer which encapsulates the first and second polysilicon gates; and
      an opening formed in the insulating layer and exposing at least a portion of a surface of the first polysilicon gate outside the channel region; and
   (b) exposing the device to a noble gas halide to substantially remove the first polysilicon layer.

9. The method of claim 8 wherein the insulating layer is formed from a material selected from the group consisting of $SiO_2$, SiN, $Ta_2O_5$, $ZrO_2$, $HfO_2$, BST, $TiO_2$, $TiSi_xO_y$, Zr—Al—O and $SrTiO_3$.

10. The method of claim 8 wherein the insulating layer is formed from silicon dioxide.

11. The method of claim 8 wherein the device is exposed to gas phase xenon difluoride or xenon dibromide.

12. The method of claim 11 wherein the device is exposed to the noble gas halide at ambient temperature without external heating.

13. The method of claim 12 wherein the device is exposed to the noble gas halide under a partial vacuum.

14. The method of claim 8 wherein the partially fabricated semiconductor device is a MOSFET.

* * * * *